(12) United States Patent
Gibbons et al.

(10) Patent No.: US 10,003,183 B2
(45) Date of Patent: Jun. 19, 2018

(54) CABLE MANAGEMENT SYSTEMS

(71) Applicant: TerraPower, LLC, Bellevue, WA (US)

(72) Inventors: Peter W. Gibbons, Kennewick, WA (US); Ashok Odedra, Bellevue, WA (US); P. Harley Park, Bellevue, WA (US); James B. Waldo, Bellevue, WA (US)

(73) Assignee: TerraPower, LLC, Bellevue, WA (US)

( * ) Notice: Subject to any disclaimer, the term of this patent is extended or adjusted under 35 U.S.C. 154(b) by 0 days. days.

(21) Appl. No.: 15/612,782

(22) Filed: Jun. 2, 2017

(65) Prior Publication Data

US 2018/0062369 A1    Mar. 1, 2018

Related U.S. Application Data

(60) Provisional application No. 62/382,648, filed on Sep. 1, 2016.

(51) Int. Cl.
| | | |
|---|---|---|
| *G06F 11/14* | (2006.01) | |
| *H02G 11/02* | (2006.01) | |
| *H02G 3/08* | (2006.01) | |
| *H02G 3/16* | (2006.01) | |
| *F21V 23/02* | (2006.01) | |
| *G21C 5/02* | (2006.01) | |
| *G21C 19/04* | (2006.01) | |
| *G21C 19/36* | (2006.01) | |

(52) U.S. Cl.
CPC .............. *H02G 11/02* (2013.01); *F21V 23/02* (2013.01); *G21C 5/02* (2013.01); *H02G 3/083* (2013.01); *H02G 3/16* (2013.01); *G21C 19/04* (2013.01); *G21C 19/36* (2013.01); *H01L 2924/16195* (2013.01)

(58) Field of Classification Search
CPC .......... H02G 11/02; H02G 3/16; H02G 3/083; F21V 23/02; G21C 5/02
USPC .......................................................... 174/542
See application file for complete search history.

(56) References Cited

U.S. PATENT DOCUMENTS

| | | | |
|---|---|---|---|
| 2,886,258 A | 5/1959 | Haugwitz | |
| 3,463,374 A | 8/1969 | Meyer | |
| 3,719,348 A | 3/1973 | Wells | |
| 4,445,668 A | 5/1984 | Sauber | |
| 4,523,724 A | 6/1985 | Rerolle | |
| 4,921,182 A * | 5/1990 | Rerolle | B65H 54/80 242/470 |

(Continued)

FOREIGN PATENT DOCUMENTS

| | | | |
|---|---|---|---|
| EP | 2602890 A2 * | 6/2013 | ............. H02G 11/02 |
| GB | 1442992 A | 7/1976 | |

OTHER PUBLICATIONS

Hahn et al., Conceptual Design of the Sodium-Cooled Fast Reactor Kalimer-600, Nuclear Engineering and Technology, vol. 39, No. 3, Jun. 2007.

(Continued)

*Primary Examiner* — Timothy Thompson
*Assistant Examiner* — Charles Pizzuto

(57) ABSTRACT

A cable management system has an outer rotating plug. An inner rotating plug is disposed off-center from and within the outer rotating plug. The inner rotating plug is rotatable independent of a rotation of the outer rotating plug. A tower extends from the inner rotating plug and has an arm pivotally connected to the tower which defines a cable guide.

10 Claims, 9 Drawing Sheets

(56) References Cited

U.S. PATENT DOCUMENTS

| | | | |
|---|---|---|---|
| 8,233,762 B1* | 7/2012 | Boyden | G02B 6/4452 |
| | | | 361/728 |
| 8,282,080 B2 | 10/2012 | Ballard | |
| 2010/0058669 A1* | 3/2010 | Cole | E05F 15/668 |
| | | | 49/199 |
| 2015/0115013 A1 | 4/2015 | Schutz | |
| 2015/0180186 A1* | 6/2015 | Vander Lind | H01R 35/02 |
| | | | 290/55 |
| 2017/0129355 A1* | 5/2017 | Fournier | B60L 11/1825 |

OTHER PUBLICATIONS

Yoo et al., Overall System Description and Safety Characteristics of Prototype Gen IV Sodium Cooled Fast Reactor in Korea, Nuclear Engineering and Technology, http://dx.doi.org/10.1016/j.net.2016.08.004.

* cited by examiner

CABLE MANAGEMENT SYSTEMS

CROSS-REFERENCE TO RELATED APPLICATIONS

This application claims the benefit of U.S. Provisional Patent Application No. 62/382,648, filed Sep. 1, 2016, entitled "CABLE MANAGEMENT SYSTEM", the disclosure of which is hereby incorporated by reference in its entirety herein.

INTRODUCTION

Nuclear fission reactors include breed-and-burn fast reactors (also referred to as traveling wave reactors, or TWRs). TWR means a reactor that would be designed to operate indefinitely using natural uranium, depleted uranium, spent light water reactor fuel, or thorium as a reload fuel after start up, and in which waves that breed and then burn would travel relative to the fuel. Thus, in some aspects, the TWR is a once-through fast reactor that runs on subcritical reload fuel which is bred up to a useful state and burned in situ. In a TWR, a wave of breeding and fissioning (a "breed-burn wave") is originated in a central core of the reactor and moves relative to the fuel. In cases where the fuel is stationary, the breed and burn wave expands outward from the ignition point. In some cases, the fuel may be moved so that the breed and burn wave stays stationary relative to the core (e.g., a standing wave) but moves relative to the fuel; a standing wave is to be considered a type of TWR. Movement of fuel assemblies is referred to as "fuel shuffling" and can accomplish the standing wave, adjustment to reactor characteristics (heat, flux, power, fuel burn up, etc.). The central core in which the fuel assemblies are shuffled is disposed in a reactor vessel. The fuel assemblies include fissile nuclear fuel assemblies and fertile nuclear fuel assemblies. Reactivity control assemblies may also be disposed in the central core for adjustment of reactor characteristics.

Fission energy defined by the standing wave creates thermal energy which is transferred in series through one or more primary coolant loops and intermediate coolant loops to steam generators to produce electricity, and low temperature heat is rejected through a set of water-cooled vacuum condensers. The separation of coolant systems into both primary and intermediate coolant loops helps maintain the integrity of the core and the primary coolant loops. In the TWR, both the primary and intermediate coolant loops utilize liquid sodium as the coolant.

SUMMARY

In on one aspect, the technology relates to a cable management system, having: an outer rotating plug having an outer rotating plug axis; an inner rotating plug disposed off-center from and within the outer rotating plug, the inner rotating plug having an inner rotating plug axis, wherein the inner rotating plug is rotatable independent of a rotation of the outer rotating plug; and a tower extending from the inner rotating plug, the tower having an arm pivotally connected to the tower, wherein the arm pivots about an arm axis parallel to the inner rotating plug axis; and wherein the arm defines a cable guide. In an embodiment, the tower is disposed off-center from the inner rotating plug axis. In another embodiment, the cable guide has a cable guide axis, the cable guide axis being parallel to the arm axis. In yet another embodiment, the arm is connected to the tower at an outer circumference of the tower. In still another embodiment, the system further includes a gantry secured to an overhead structure positioned above the tower.

In another embodiment of the above aspect, the gantry includes a gantry cable guide having a gantry cable guide axis parallel to the arm axis. In an embodiment, the gantry is configured to allow the gantry cable guide to move in a plane orthogonal to the cable guide axis, thereby accommodating movement resulting from rotation of the inner rotating plug and the outer rotating plug. In another embodiment, the gantry includes: a gantry arm pivotally secured on a first end and movably coupled to the overhead structure on a second end; and a gantry extension arm linearly movably coupled to the gantry arm, wherein a distal end of the gantry extension arm includes the gantry cable guide. In yet another embodiment, the gantry includes: a first guide rail and a second guide rail parallel to the first guide rail; a first gantry arm movably coupled to the first and second guide rails; and a second gantry arm movably coupled to the first and second guide rails and parallel to the first gantry arm, wherein the gantry cable guide is disposed between, and movably coupled to, the first gantry arm and the second gantry arm. In still another embodiment, the system further includes a cable passing through the cable guide and contacting the outer rotating plug at a fixed location.

BRIEF DESCRIPTION OF THE DRAWINGS

The following drawing figures, which form a part of this application, are illustrative of described technology and are not meant to limit the scope of the technology as claimed in any manner, which scope shall be based on the claims appended hereto.

DETAILED DESCRIPTION

Figure 1:
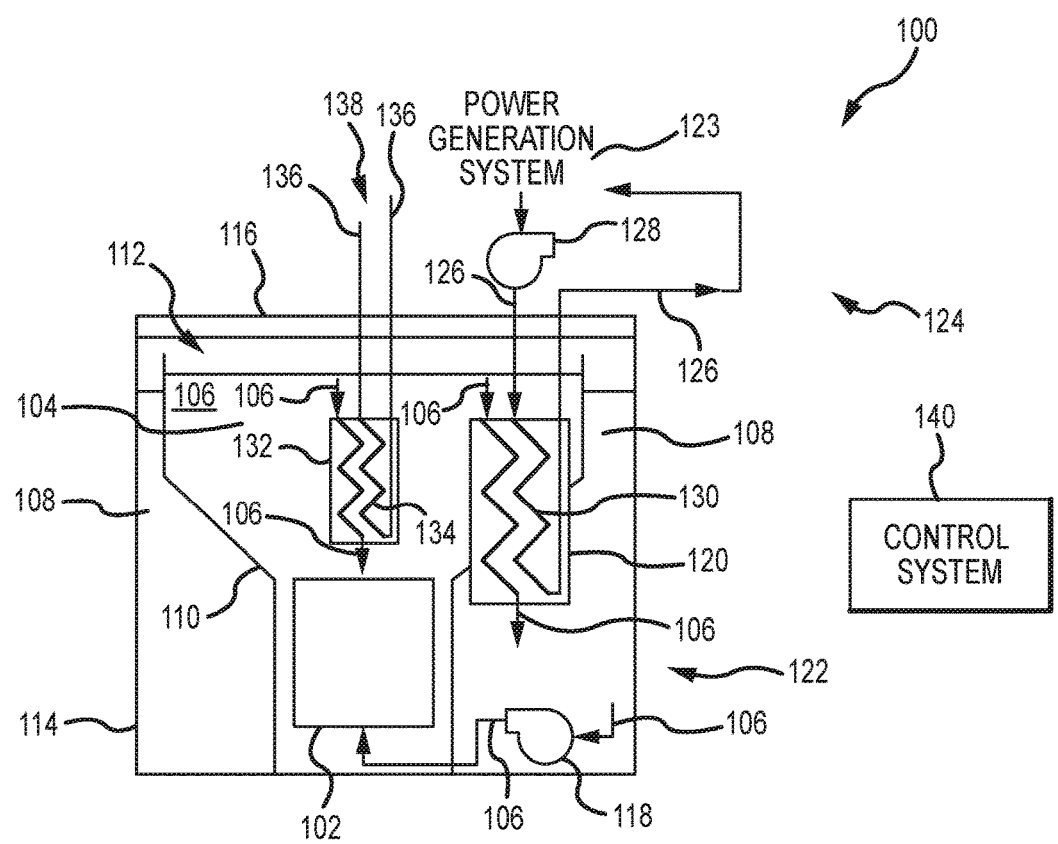
FIG. 1 illustrates, in a block diagram form, some of the basic components of a traveling wave reactor.

FIG. 1 illustrates, in a block diagram form, some of the basic components of a travelling wave reactor (TWR) 100. In general, the TWR 100 includes a reactor core 102 containing a plurality of fuel assemblies (not shown). The core 102 is disposed at the lowest position within a pool 104 holding a volume of liquid sodium coolant 106. The pool 104 is referred to as a hot pool and has a sodium temperature higher than that of a surrounding cold pool 108 (due to the energy generated by the fuel assemblies in the reactor core 102), which also contains liquid sodium coolant 106. The hot pool 104 is separated from the cold pool 108 by an inner vessel 110. A headspace 112 above the level of the sodium coolant 106 may be filled with an inert cover gas, such as argon. A containment vessel 114 surrounds the reactor core 102, hot pool 104, and cold pool 108, and is sealed with a reactor head 116. The reactor head 116 provides various access points into the interior of the containment vessel 114.

The size of the reactor core 102 is selected based on a number of factors, including the characteristics of the fuel, desired power generation, available reactor 100 space, and so on. Various embodiments of a TWR may be used in low power (around 300 MW$_e$-around 500 MW$_e$), medium power (around 500 $MW_e$-around 1000 $MW_e$), and large power (around 1000 $MW_e$ and above) applications, as required or desired. The performance of the reactor 100 may be improved by providing one or more reflectors, not shown, around the core 102 to reflect neutrons back into the core 102. Additionally, fertile and fissile nuclear assemblies are moved (or "shuffled") within and about the core 102 to control the nuclear reaction occurring therein. Components for moving these nuclear assemblies within the core are the subject of this application and are described in more detail below in FIGS. 2A-3C.

The sodium coolant 106 is circulated within the vessel 114 via a primary sodium coolant pump 118. The primary coolant pump 118 draws sodium coolant 106 from the cold pool 108 and injects it into a plenum below the reactor core 102. The coolant 106 is forced upward through the core and is heated due to the reactions taking place within the reactor core 102. Heated coolant 106 enters an intermediate heat exchanger 120 from an upper portion of the hot pool 104, and exits the intermediate heat exchanger 120 at a location in the cold pool 108. This primary coolant loop 122 thus circulates sodium coolant 106 entirely within the reactor vessel 114.

The intermediate heat exchanger 120 also includes liquid sodium coolant and acts as a barrier between the primary coolant loop 122 and a power generation system 123, so the integrity of the core 102 and primary coolant loop 122 can be ensured. The intermediate heat exchanger 120 transfers heat from the primary coolant loop 122 (fully contained within the vessel 114) to an intermediate coolant loop 124 (that is only partially located within the vessel 114). The intermediate heat exchanger 120 passes through an opening in the inner vessel 110, thus bridging the hot pool 104 and the cold pool 108 (so as to allow flow of sodium 106 in the primary coolant loop 122 therebetween). In an embodiment, four intermediate heat exchangers 120 are distributed within the vessel 114.

The intermediate coolant loop 124 circulates sodium coolant 126 that passes through pipes into and out of the vessel 114, via the reactor head 116. An intermediate sodium pump 128 located outside of the reactor vessel 114 circulates the sodium coolant 126. Heat is transferred from the sodium coolant 106 of the primary coolant loop 122 to the sodium coolant 126 of the intermediate coolant loop 124 in the intermediate heat exchanger 120. The sodium coolant 126 of the intermediate coolant loop 124 passes through a plurality of tubes 130 within the intermediate heat exchanger 120. These tubes 130 keep separate the sodium coolant 106 of the primary coolant loop 122 from the sodium coolant 126 of the intermediate coolant loop 124, while transferring heat energy therebetween.

A direct heat exchanger 132 extends into the hot pool 104 and provides additional cooling to the sodium coolant 106 within the primary coolant loop 122. The direct heat exchanger 132 is configured to allow sodium coolant 106 to enter and exit the heat exchanger 132 from the hot pool 104. The direct heat exchanger 132 has a similar construction to the intermediate heat exchanger 120, where tubes 134 keep separate the sodium coolant 106 of the primary coolant loop 122 from a direct heat exchanger coolant 136 of a direct reactor coolant loop 138, while transferring heat energy therebetween.

Other ancillary reactor components (both within and outside of the reactor vessel 114) include, but are not limited to, pumps, check valves, shutoff valves, flanges, drain tanks, etc., that are not depicted but would be apparent to a person of skill in the art. Additional penetrations through the reactor head 116 (e.g., a port for the primary coolant pump 118, inert cover gas and inspection ports, sodium processing ports, etc.) are not depicted. A control system 140 is utilized to control and monitor the various components of the reactor 100.

Broadly speaking, this disclosure describes configurations that improve the performance of the reactor 100 described in FIG. 1. Specifically, embodiments, configurations, and arrangements of cable management systems are shown and described in more detail below with reference to FIGS. 2A-3C.

Figure 2A:
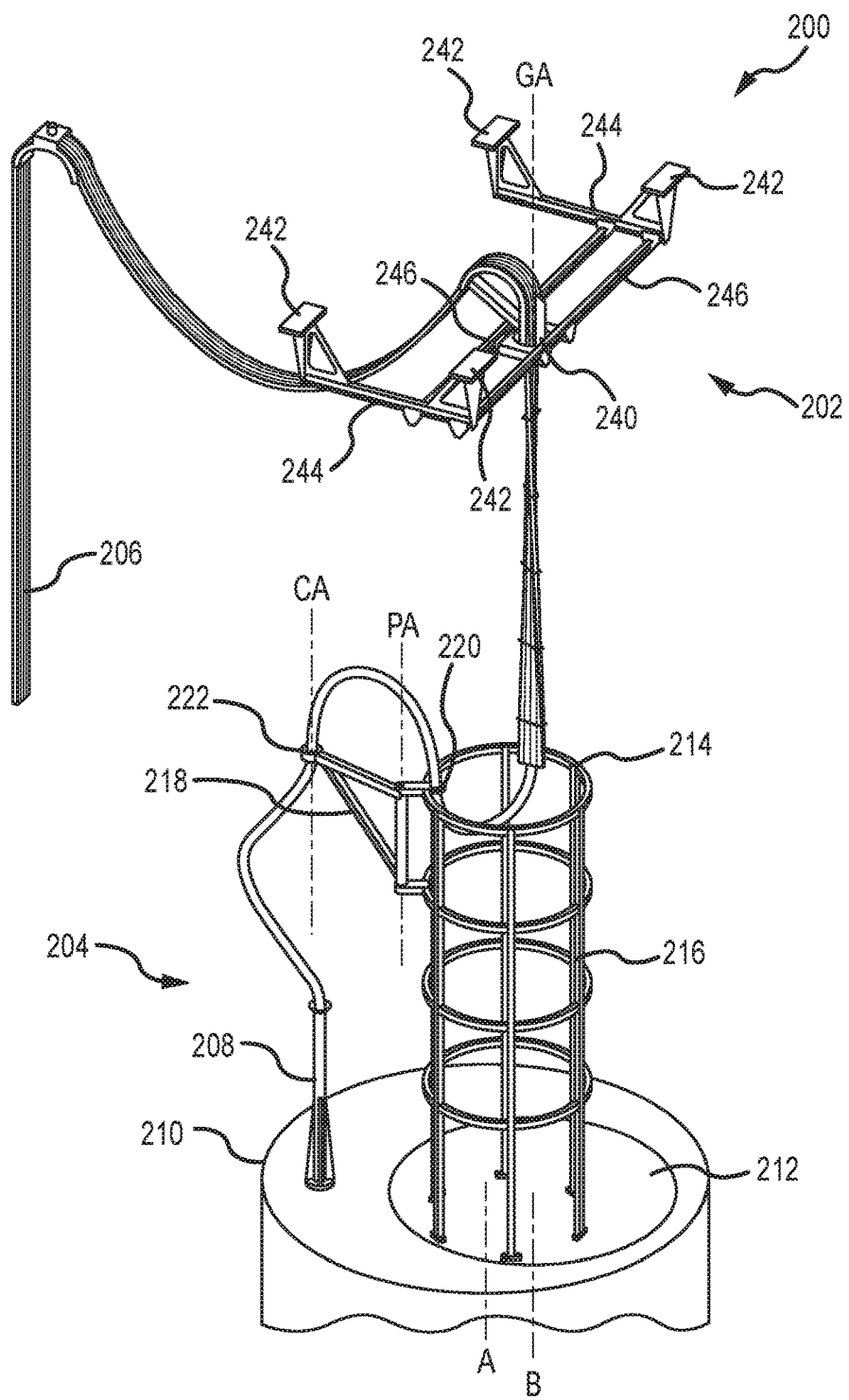
FIG. 2A is a perspective view of an example cable management system.
Figure 2B:
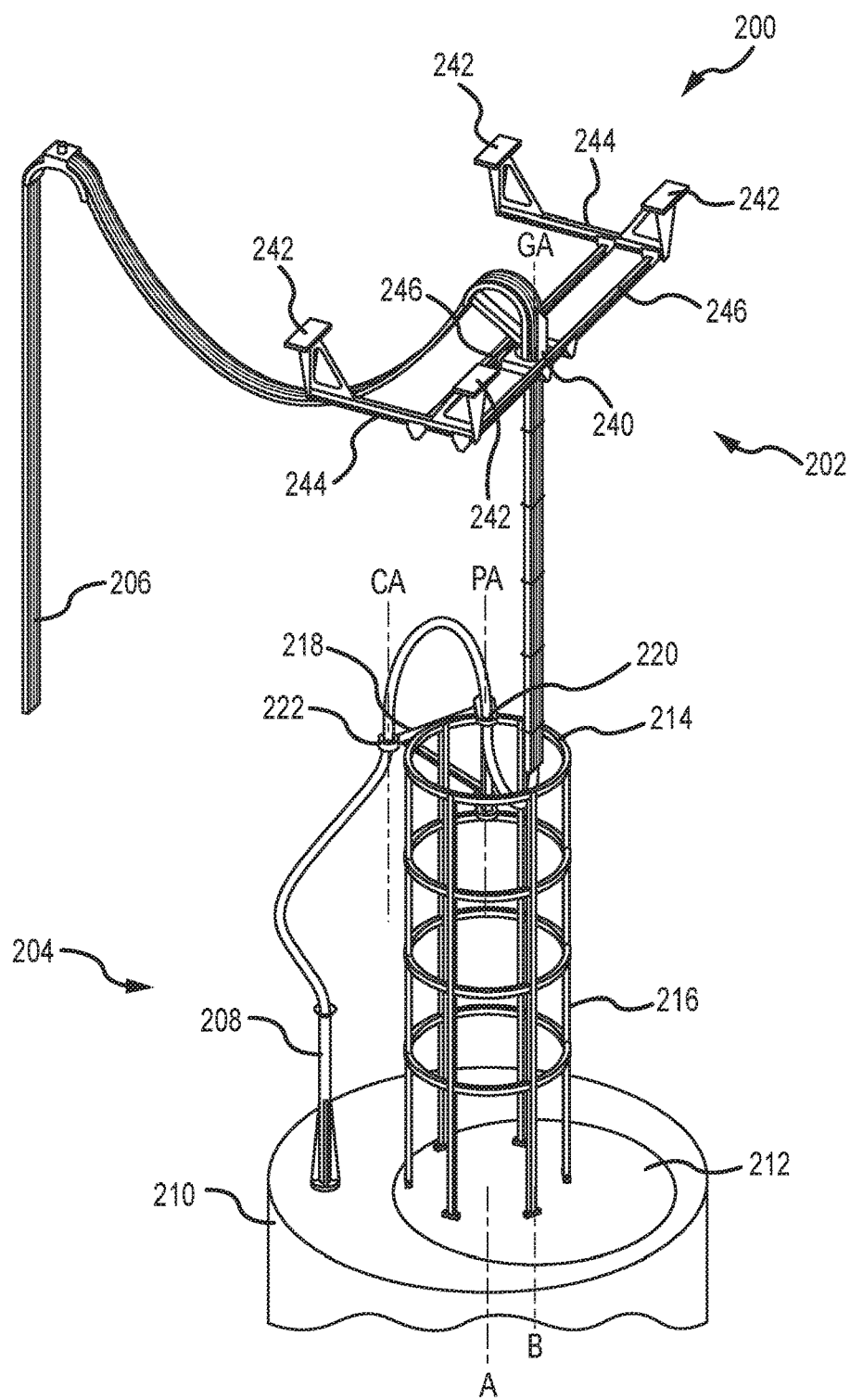
FIGS. 2B-2E are perspective views of the cable management system shown in FIG. 2A in various relative positions.
Figure 2C:
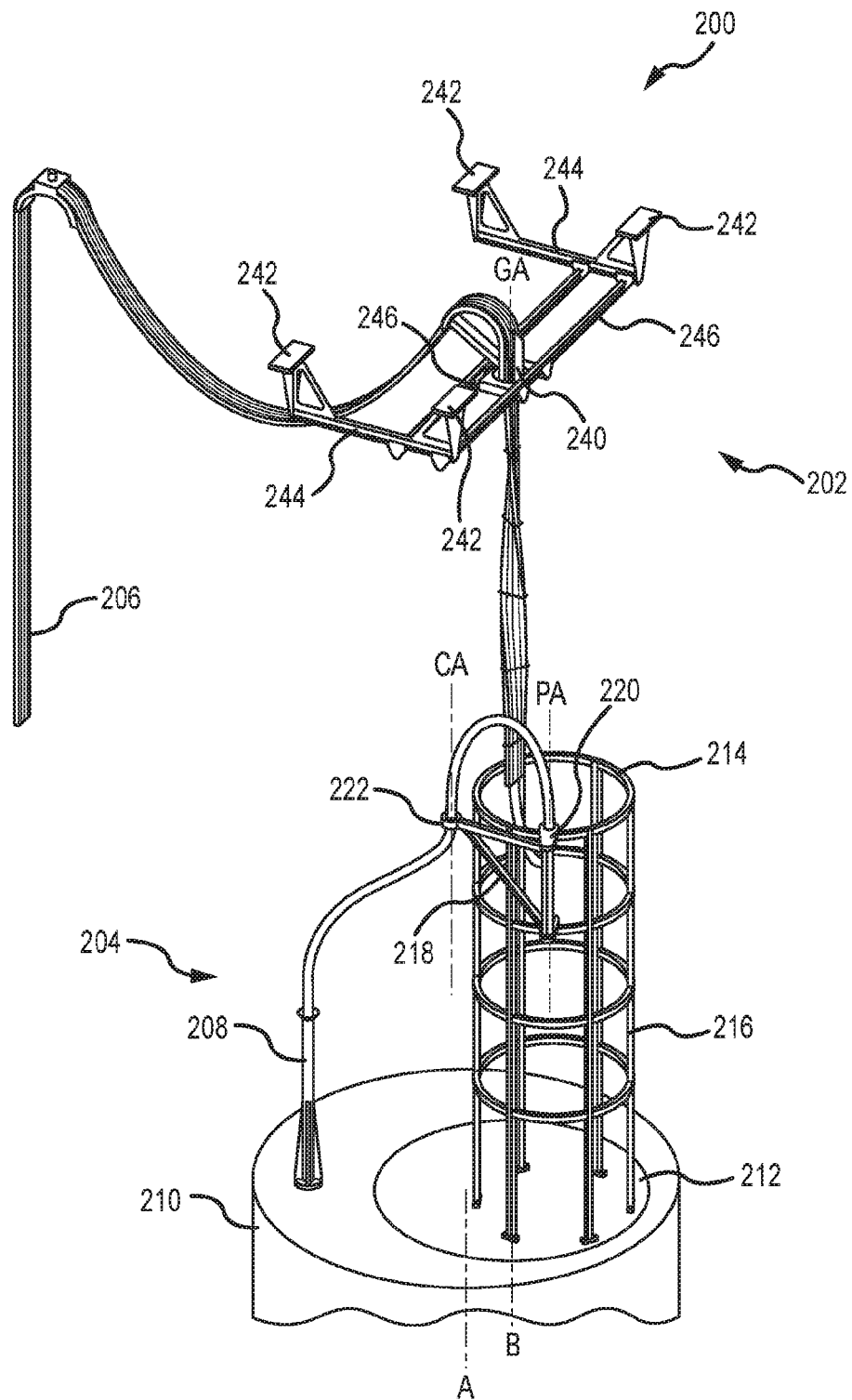
Figure 2D:
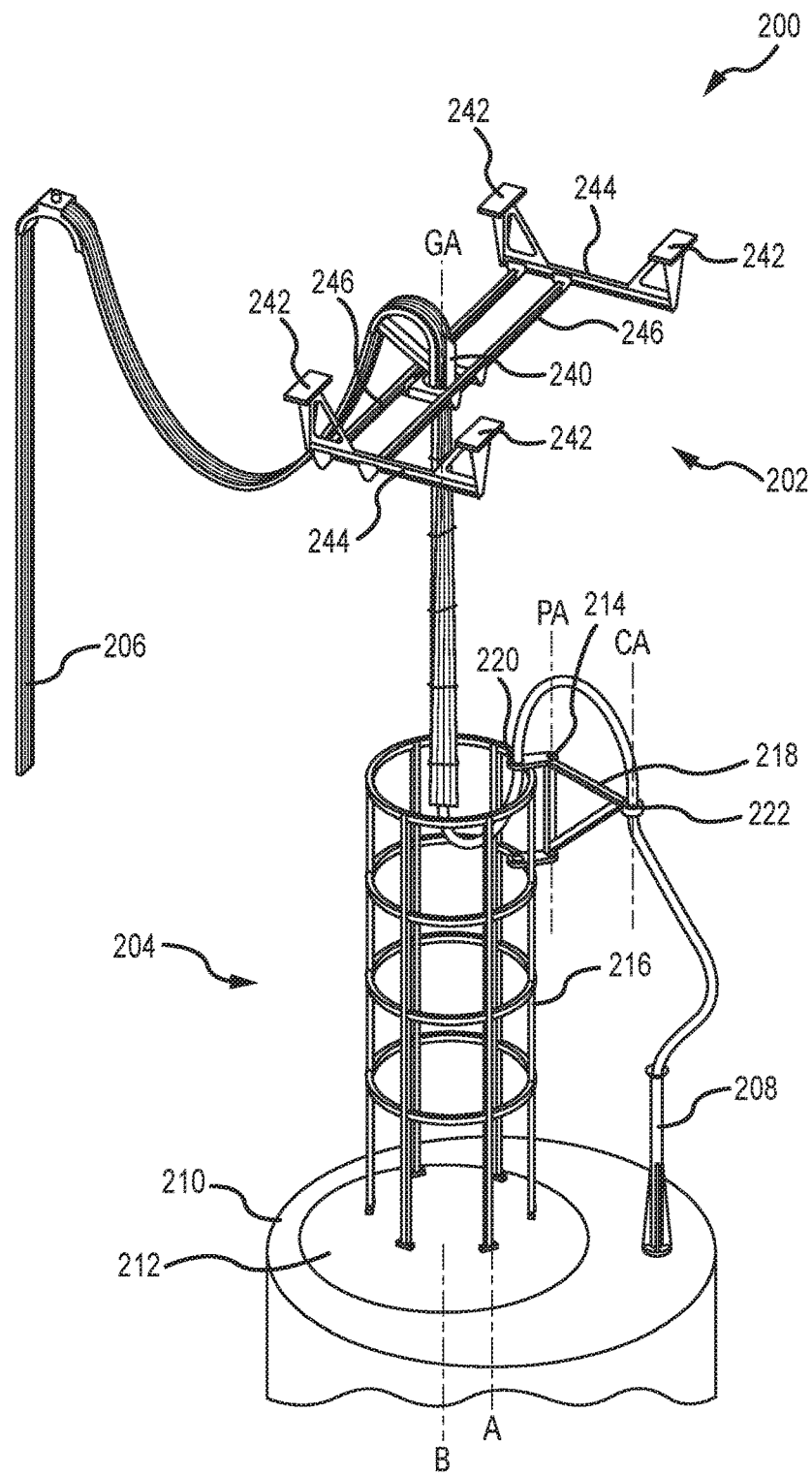
Figure 2E:
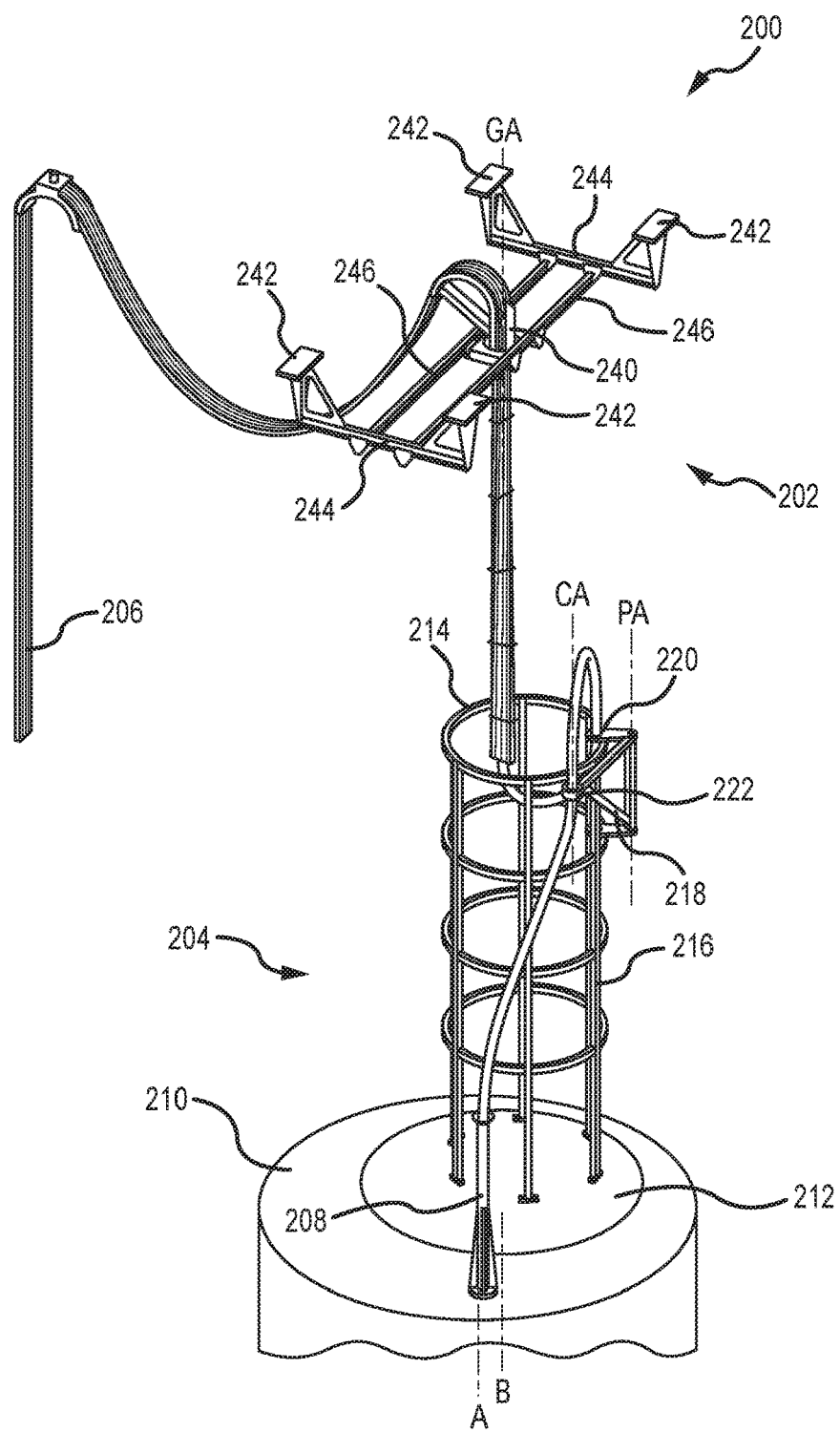

FIG. 2A is a perspective view of an example embodiment of a cable management system 200. The example cable management system 200 includes gantry portion 202 and plug portion 204. Cable 206, which can be used for sensors, power, etc., is also shown. Typically, cable management system 200 is positioned within a reactor hall. Cable 206 is supported by gantry portion 202 and plug portion 204 and enters cable collector 208. From cable collector 208, individual cables are routed to electrical cabinets, motors, heaters, etc., as needed. FIGS. 2A-2E show cable management system 200 in various rotational positions and are discussed concurrently below.

In FIG. 2A and the following figures, many components of the plug assembly 204 are omitted for clarity. Some components include an in-vessel rod handling assembly that manages the locations of various fuel assemblies within the vessel by moving fuel assemblies between and within the core and the storage areas of the vessel. The in-vessel rod handling assembly also facilities movement of fuel assemblies into an out of the reactor vessel (via one or more penetrations in the reactor head).

In order to reach various positions within and just outside the core, the plug portion 204 rotates, thereby repositioning the in-vessel rod handling assembly. Because cable 206 enters the reactor assembly via a fixed position, cable 206 moves as a result of the different rotations possible by the plug portion 204. Generally, it is desirable to keep cable 206 suspended above plug portion 204 and minimize its possible interaction or interference with the components of plug portion 204. Cooperation between gantry portion 202 and plug portion 204 enables this performance.

Typically, cable 206 is made of a flexible material having a minimum bend radius. It is desirable to minimize the motion and/or swinging of cable 206 during plug rotation. In some instances, cable 206 includes a subset or portion of cable 206 that enters cable collector 208 and are exclusive to outer plug 210. By having movable gantry components and pivotable tower components in the plug portion 204, discussed below in more detail, movement of cable 206 is controlled or minimized during plug rotation. Additionally, the cooperative accommodations provided by gantry and tower components minimize bending and/or twisting of cable 206 during plug rotation. Also, this arrangement provides a footprint that is more compact, in some instances, significantly more compact, than a traditional tracked multi-loop festoon arrangement. Because the area in and around the plugs 204 is already crowded, reducing the footprint is beneficial and important.

Plug portion 204 includes outer rotating plug 210 and inner rotating plug 212. Outer rotating plug 210 rotates about central axis A and typically have a range of rotation of +/−180 degrees. Other ranges of rotation are contemplated and in some instances, the rotation range may exceed 360 degrees. Typically, reactor head 116 depicted in FIG. 1 surrounds the outer rotating plug 210.

Inner rotating plug 212 is positioned within the outer rotating plug 210. The inner rotating plug 212 has a central axis B that is radially offset from the central axis A of the outer rotating plug 210. Additionally, the inner rotating plug 212 is rotatable independent of the rotation of the outer rotating plug 210. The inner rotating plug 212 has a range of rotation of +/−90 degrees relative to the outer plug 210 position.

Tower assembly 214 is secured to inner rotating plug 212 at a position radially off-center from central axis B and rotates with inner rotating plug 212. Tower assembly 214 includes support structure 216 and arm 218 pivotally attached to the support structure 216 at an outer circumference of the support structure 216. The arm 218 pivots about axis PA oriented parallel to central axis A of outer rotating plug 210 and parallel to central axis B of inner rotating plug 212. Preferably, as shown, axis PA is positioned a distance from the outer circumference of support structure 216. The total pivot range is limited by contact between the arm 218 and support structure 216 at the pivot extremes, which depending on relative axes positions, is anywhere between 150 to 270 degrees. Arm 218 pivots as a result of the inner rotating plug 212 rotating relative to outer rotating plug 210.

Support structure 216 includes cable guide 220. Generally, cable guide 220 receives a portion of cable 206 from gantry 202 and defines a channel having an axis parallel to axes A, B, and PA. Arm 218 includes cable guide 222 positioned on a distal end. Cable guide 222 defines a channel having an axis CA parallel to axes A, B, and PA. As inner rotating plug 212 rotates, with outer rotating plug 210 stationary, arm 218 pivots and cable guide 222 maintains its relative orientation where channel axis CA is parallel to axes A, B and PA.

Gantry portion 202 supports cable 206 and generally directs cable 206 towards tower 216. Gantry portion 202 includes gantry cable guide 240, securing members 242, guide rails 244, and gantry arms 246. Gantry portion 202 is secured to a surface above plug portion 204, such as a ceiling or cross beam, via securing members 242. Gantry cable guide 240 defines gantry cable guide axis GA that is parallel to axes CA, A, B, and PA.

Gantry cable guide 240 is movably coupled to gantry arms 246 such that gantry cable guide 240 can move along the length of gantry arms 246. Gantry arms 246 are movably coupled to guide rails 244 such that gantry arms can move along the length of gantry arms 246. For instance, gantry arms 246 include rollers for smooth operation. The movable coupling of the gantry cable guide 240 to gantry arms 246, which are in turn movably coupled to guide rails 244, enables gantry cable guide 240 to move freely in a plane orthogonal to the pivot axis PA.

Each of the gantry arms 246 are aligned parallel to each other. Each of the guide rails 244 are oriented parallel to each other. As shown, gantry arms 246 are oriented orthogonal to guide rails 244. Thereby, gantry cable guide 240 moves as the result of linear movement along the gantry arms 246 and as a result of linear movement of the gantry arms 246 along guide rails 244. In general, these linear movements occur, passively, as a result of rotations of outer rotating plug 210 and inner rotating plug 212. In some instances, one or more components of gantry 202 may be drive by motors that are synchronized with plug rotations.

Figure 3A:
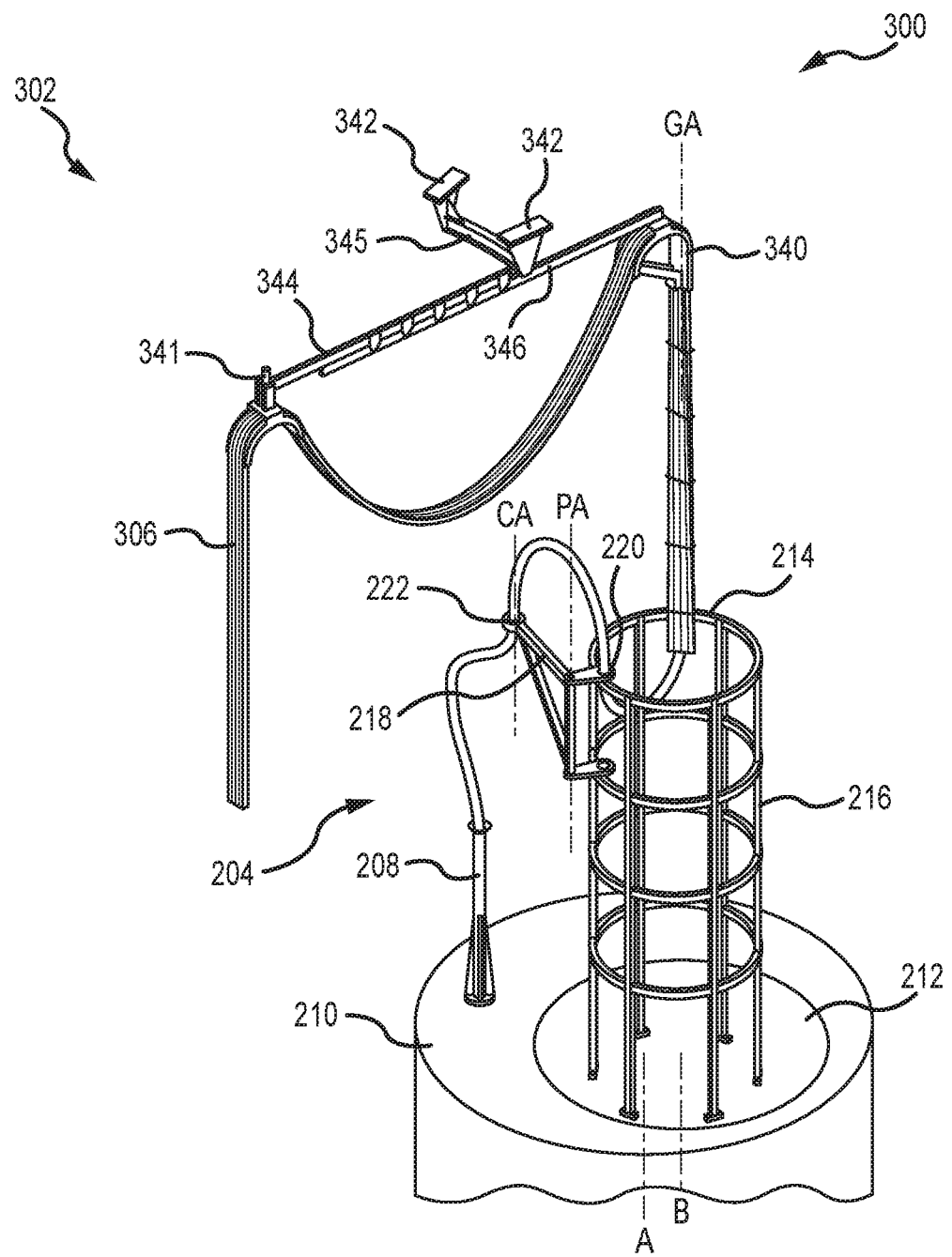
FIG. 3A is a perspective view of an example cable management system.
Figure 3B:
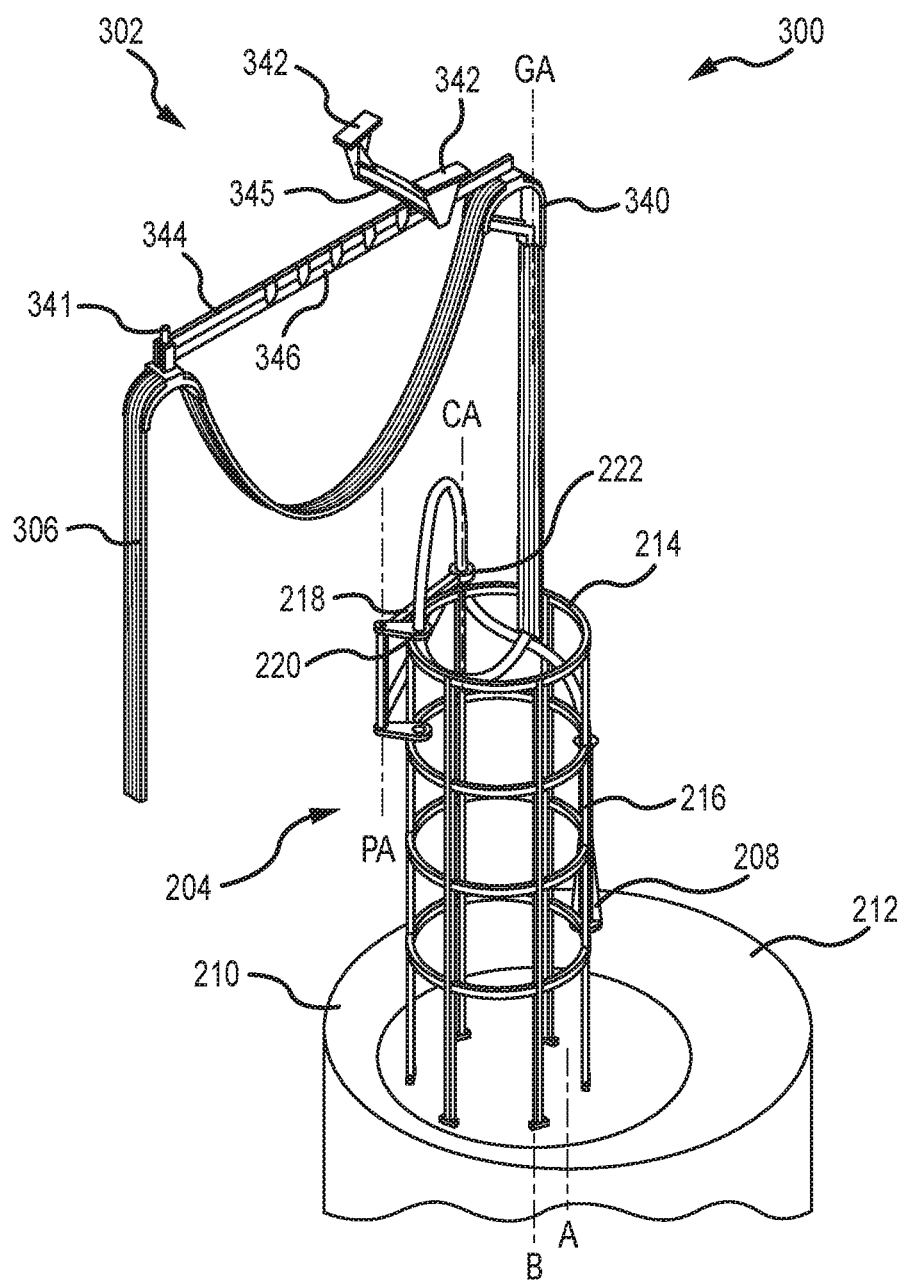
FIGS. 3B-3C are perspective views of the cable management system shown in FIG. 3A in various relative positions.
Figure 3C:
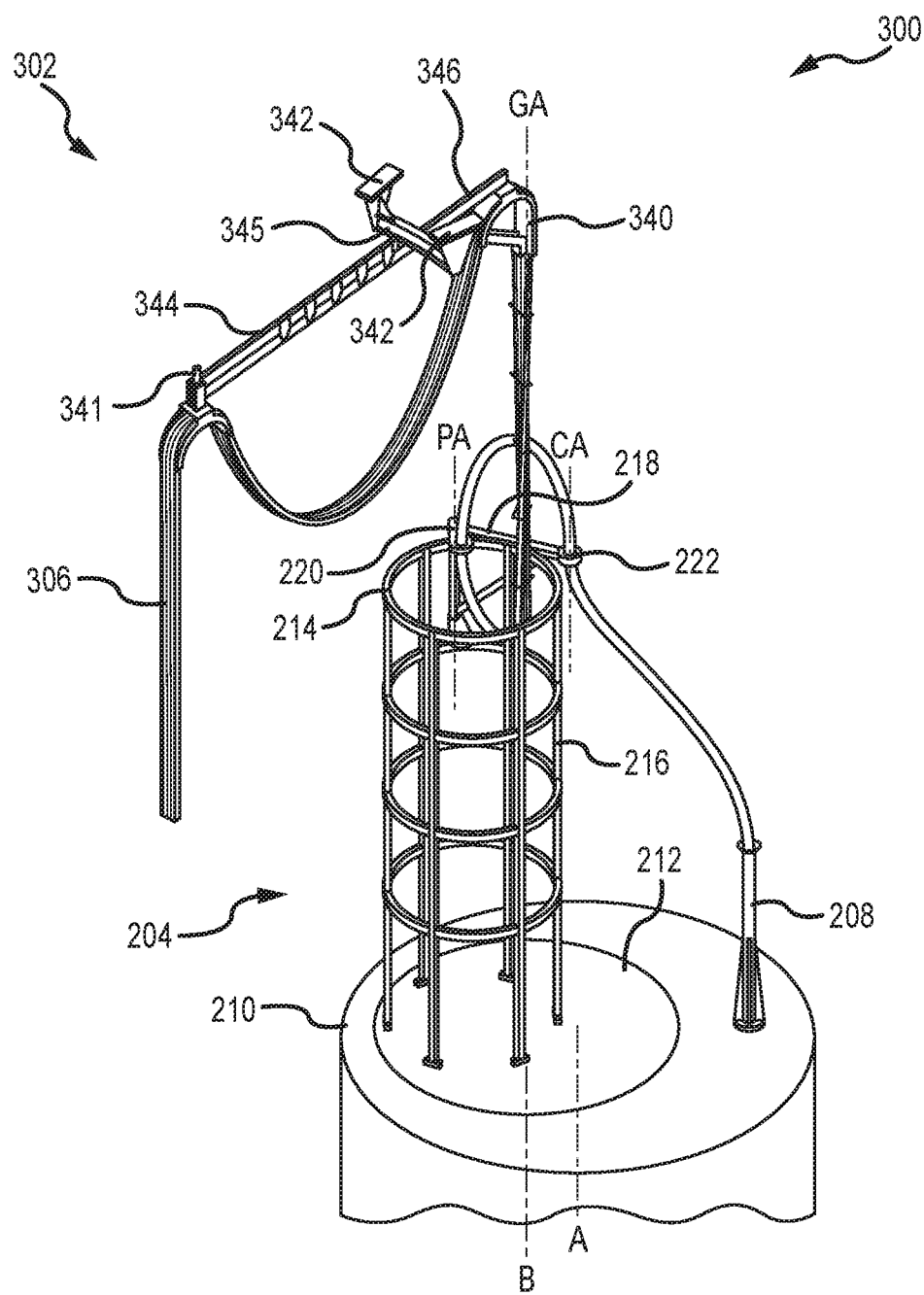

FIG. 3A is a perspective view of an example embodiment of a cable management system 300. The example cable management system 300 includes gantry portion 302 and plug portion 204 positioned within reactor hall. Plug portion 204 is the same as that shown in, and described with reference to, FIGS. 2A-2E, above. Cable 206 is supported by gantry portion 302 and plug portion 204 and are routed to cable collector 208. FIGS. 3A-3C show cable management system 300 in various rotational positions and are discussed concurrently below.

Gantry portion 302 supports cable 306 and generally directs cable 306 towards tower 216. Gantry portion 302 includes gantry cable guide 340, pivot member 341, securing members 342, gantry arm 344, guide rail 345, and gantry extension arm 346. Near one end, gantry arm 344 302 is secured to a surface above plug portion 204, such as a ceiling or cross beam, via securing members 342. On or near another end, gantry arm 344 is pivotally secured via pivot member 341, which is also secured to the surface above plug portion 204. Gantry cable guide 340 defines gantry cable guide axis GA that is parallel to axes CA, A, B, and PA.

Gantry arm 344 is pivotally coupled to pivot member 341 on one end and movably coupled to guide rail 345 on the other end. As shown, guide rail 345 has an arc-shape enabling the gantry arm 344 to pivot relative to the pivot member 341 while being slidably coupled to the guide rail 345. Gantry arm 344 includes rollers to provide smooth movement along guide rail 345.

Gantry extension arm 346 is movably coupled to gantry arm 344 via rollers and is connected to gantry cable guide 340. As gantry arm 344 pivots, so too does gantry extension arm 346. Movement of gantry extension arm 346 in the plane perpendicular to gantry cable guide axis GA enables the gantry cable guide 340 to passively respond to rotational movement of the inner plug 212, outer plug 210, or both. Thus, cable guide 340 moves as a result of radial movement of gantry arm 344 along guide rail 345 and as a result of linear movement of gantry extension arm 346 along gantry arm 344, in addition to the rotation of plugs 210 and 212.

It is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting. It must be noted that, as used in this specification, the singular forms "a," "an," and "the" include plural referents unless the context clearly dictates otherwise.

It will be clear that the systems and methods described herein are well adapted to attain the ends and advantages mentioned as well as those inherent therein. Those skilled in the art will recognize that the methods and systems within this specification may be implemented in many manners and as such is not to be limited by the foregoing exemplified embodiments and examples. In this regard, any number of the features of the different embodiments described herein may be combined into one single embodiment and alternate embodiments having fewer than or more than all of the features herein described are possible.

While various embodiments have been described for purposes of this disclosure, various changes and modifications may be made which are well within the scope contemplated by the present disclosure. Numerous other changes may be made which will readily suggest themselves to those skilled in the art and which are encompassed in the spirit of the disclosure.

We claim:

1. A cable management system, comprising:
   an outer rotating plug comprising an outer rotating plug axis;

an inner rotating plug disposed off-center from and within the outer rotating plug, the inner rotating plug comprising an inner rotating plug axis, wherein the inner rotating plug is rotatable independent of a rotation of the outer rotating plug; and a tower extending from the inner rotating plug, the tower comprising an arm pivotally connected to the tower, wherein the arm pivots about an arm axis parallel to the inner rotating plug axis; and wherein the arm defines a cable guide.

2. The cable management system according to claim 1, wherein the tower is disposed off-center from the inner rotating plug axis.

3. The cable management system according to claim 1, wherein the cable guide has a cable guide axis, the cable guide axis being parallel to the arm axis.

4. The cable management system according to claim 1, wherein the arm is connected to the tower at an outer circumference of the tower.

5. The cable management system according to claim 1, further comprising a gantry secured to an overhead structure positioned above the tower.

6. The cable management system according to claim 5, wherein the gantry includes a gantry cable guide having a gantry cable guide axis parallel to the arm axis.

7. The cable management system according to claim 6, wherein the gantry is configured to allow the gantry cable guide to move in a plane orthogonal to the cable guide axis, thereby accommodating movement resulting from rotation of the inner rotating plug and the outer rotating plug.

8. The cable management system according to claim 6, wherein the gantry includes:

a gantry arm pivotally secured on a first end and movably coupled to the overhead structure on a second end; and a gantry extension arm linearly movably coupled to the gantry arm, wherein a distal end of the gantry extension arm includes the gantry cable guide.

9. The cable management system according to claim 6, wherein the gantry includes:

a first guide rail and a second guide rail parallel to the first guide rail;

a first gantry arm movably coupled to the first and second guide rails; and a second gantry arm movably coupled to the first and second guide rails and parallel to the first gantry arm, wherein the gantry cable guide is disposed between, and movably coupled to, the first gantry arm and the second gantry arm.

10. The cable management system according to claim 1, further comprising a cable passing through the cable guide and contacting the outer rotating plug at a fixed location.

* * * * *